United States Patent
Chen et al.

(10) Patent No.: US 6,722,022 B2
(45) Date of Patent: Apr. 20, 2004

(54) APPARATUS FOR CALIBRATING THE POSITION OF A WAFER PLATFORM IN AN ION IMPLANTER

(75) Inventors: Lu-Chang Chen, Hsinchu (TW); Yu-Chun Peng, Hsinchu (TW); Yi-Yao Tang, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/140,734

(22) Filed: May 7, 2002

(65) Prior Publication Data

US 2003/0209050 A1 Nov. 13, 2003

(51) Int. Cl.⁷ .......................... B23P 19/00; B23P 21/00; G11B 5/127
(52) U.S. Cl. .......................... 29/760; 29/705; 29/729; 29/737; 29/603.09; 29/603.04
(58) Field of Search .......................... 29/407, 705, 729, 29/737, 603.09, 760, 603.04; 250/492.2, 492.21, 492.22, 492.23, 505.1, 251, 252.1, 253, 559.22, 559.29, 396 R

(56) References Cited

U.S. PATENT DOCUMENTS

| 5,546,179 A | * | 8/1996 | Cheng | .......................... 356/73 |
| 5,770,863 A | * | 6/1998 | Nakasuji | .................. 250/492.2 |

* cited by examiner

*Primary Examiner*—John C. Hong
(74) *Attorney, Agent, or Firm*—Tung & Associates

(57) ABSTRACT

An apparatus and a method for calibrating the position of a wafer platform in an ion implanter, and particularly in a medium current ion implanter. The apparatus is constructed by a curvilinear piece formed in a half-circular shape, a pair of linear rods for supporting the curvilinear piece, and at least one cross-bracing rod connected in-between the pair of linear rods for providing rigidity of the apparatus. When the inside peripheral surface of the curvilinear piece intimately engages an outside peripheral surface of the wafer platform of the ion implanter, or when the first and second linear rods fit snugly on the implanter indicative that the wafer platform is properly calibrated at a zero-angle position. When such fitting is not possible, the wafer platform is then adjusted until a snug fitting is made possible.

6 Claims, 2 Drawing Sheets

APPARATUS FOR CALIBRATING THE POSITION OF A WAFER PLATFORM IN AN ION IMPLANTER

FIELD OF THE INVENTION

The present invention generally relates to ion implanters and more particularly, relates to an apparatus and a method for calibrating the zero-angle position of a wafer platform in an ion implanter.

BACKGROUND OF THE INVENTION

Ion beam implanters are used to implant or "dope" silicon wafers with impurities to produce n or p type doped regions on the wafers. The n and p type material regions are utilized in the production of semiconductor integrated circuits. Implanting ions generated from source materials such as antimony, arsenic or phosphorus results in n type material. If p type material is desired, ions generated with source materials such as boron, gallium or indium are typically used.

The ion beam implanter includes an ion source for generating positively charged ions from ionizable source materials. The generated ions are formed into a beam and accelerated along a predetermined beam path to an implantation station. The beam is formed and shaped by apparatus located along the beam path en route to the implantation station. When operating the implanter, the interior region must be evacuated to reduce the probability of ions being deflected from the predetermined beam path as a result of collisions with air molecules.

During ion implantation a surface is uniformly irradiated by a beam of ions or molecules, of a specific species and prescribed energy. The size of the wafer or substrate (e.g. 8 inches or greater) is typically much larger than the cross-section of the irradiating beam which deposits on the wafer as a spot or "ribbon" of about 1 inch. Commonly, in high current machines, the required uniform irradiance is achieved by moving the wafer through the beam.

Operation of an ion implanter results in the production of certain contaminant materials. These contaminant materials adhere to surfaces of the implanter beam forming and shaping structure adjacent the ion beam path and also on the surface of the wafer support facing the ion beam. Contaminant materials also include undesirable species of ions generated in the ion source, that is, ions having the either the wrong atomic mass or undesired ions of the same atomic mass.

In a conventional ion implanter 10 such as that shown in FIG. 1, an ion beam 12 is emitted from an ion source 14 and passed through a pre-analyzing magnet 16 to remove undesired types of ions. Ions having identical energies but different masses experience a different magnetic force as they pass through the magnetic field due to their differing masses thereby altering their pathways. As a result, only those desired ions of a particular atomic mass unit (AMU) are allowed to pass through a pre-positioned orifice in the pre-analyzing magnet.

After passing through the pre-analyzing magnet the ion beam is accelerated to a desired energy by an accelerator 18. Negative ions are changed into positive ions by a charge exchange process involving collisions with a chemically inert gas such as argon. The positive ions then pass through a post-analyzing magnet (not shown), and a pair of vertical and horizontal scanners 20,22 finally reach a wafer 24 where they impact the wafer 24 and are implanted.

Ion implantation has the ability to precisely control the number of implanted dopant atoms into substrates to within 3%. For dopant control in the $10^{14}$–$10^{18}$ atoms/cm$^3$ range, ion implantation is superior to chemical diffusion techniques. Heavy doping with an ion implanter, for example, can be used to alter the etch characteristics of materials for patterning. The implantation may be performed through materials that may already be in place while other materials may be used as masks to create specific doping profiles. Furthermore, more than one type of dopant may be implanted at the same time and at the same position on the wafer. Other advantages include the fact that ion implantation may be performed at low temperature which does not harm photoresist and in high vacuum which provides a clean environment.

A sample mounting stage 30 for the ion implanter 10 is shown in FIG. 2. The sample mounting stage 30 is constructed with a wafer platform 32 for positioning a wafer thereon. The wafer platform 32 may be equipped with electrostatic chucking (ESC) device or be provided with a mechanical clamping device. The wafer platform 32 is controlled by the mechanical motion of the rotating head 34. During the normal operation of an ion implanter, the sample mounting stage 30 must be frequently calibrated. Particularly, the wafer platform 32 for mounting of a wafer thereon must be accurately calibrated such that when a wafer (not shown) is positioned on the wafer platform 32, it is parallel with the ion beam from the ion planter. Prior to the implantation process, the wafer must first be clamped, or otherwise affixed to the wafer platform 32 and then rotated by the rotating head 34 to 90°. After the rotation or tilt of 90°, the ion beam from the ion implanter and the normal line of the wafer are parallel, and thus the commonly known term of "zero-angle". After repeated usage of the ion implanter, and the repeated rotation of the wafer platform 32, the angle of the wafer platform may be displaced with an error and therefore, the position of the wafer platform must be calibrated and corrected.

A commonly used implantation angle between the ion beam and the wafer surface is about 7° such that a channel effect can be avoided to eliminate errors caused by inaccurate depth of implantation. Under other operating conditions, for instance, at large angle implantation for the sidewalls or under a gate, the ion implanter may need constant calibration in order to carry out an accurate implantation process. A most frequently used base point for calibration is the zero-angle formed between the ion beam and the normal line of the wafer. The calibration can be advantageously carried out as long as the zero-angle between the ion beam and the normal line of the wafer is achieved.

During an attempt to calibrate the wafer platform 32 to a zero-angle position, it was discovered that the machine supplier for a medium density ion implanter does not supply a calibration tool which can be used to accurately calibrate the positioning of the wafer platform. For instance, a crude method for determining the calibration of the wafer platform is to measure the distance between the wafer edge and the support wall of the implanter. When an unequal distance is measured, the screws that fixed the position of the wafer platform are removed and then, the distances are adjusted until a ruler measures equal distance to the support wall from the wafer edge. The method is crude and difficult to execute. Its reproducibility is poor between different machine operators.

It is therefore an object of the present invention to provide a calibration method for a medium current ion implanter that does not have the drawbacks or the shortcomings of the conventional method.

It is another object of the present invention to provide an apparatus for calibrating the zero-angle of a wafer platform in a medium density ion implanter which can be used to produce reproducible result.

It is a further object of the present invention to provide an apparatus for calibrating the position of a wafer platform in a medium current ion implanter that is constructed of a curvilinear piece supported by two linear rods.

SUMMARY OF THE INVENTION

In accordance with the present invention, an apparatus and a method for calibrating the position of a wafer platform in a medium current ion implanter are provided.

In a preferred embodiment, an apparatus for calibrating the position of a wafer platform in an ion implanter is provided which includes a curvilinear piece formed of a first rigid material, the curvilinear piece has a half-circular shape, a predetermined thickness, a predetermined depth, an inside diameter, an inside peripheral surface, a first open end and a second open end, the inside diameter is substantially equal to an outside diameter of the wafer platform such that the inside peripheral surface intimately engages an outside peripheral surface of the wafer platform when the wafer platform is properly calibrated at a zero-angle position; a first and a second linear rod formed of a second rigid material that has equally a first length, a rectangular cross-section, two front ends and two backends, the two front ends have a thickness substantially equal to the predetermined thickness of the curvilinear piece for mounting the curvilinear piece thereon by engaging the first and second open ends of the curvilinear piece, the curvilinear piece may have a plane along radial direction that is perpendicular to a plane of the first and second linear rod along a longitudinal direction when the curvilinear piece is mounted to the first and second linear rod, the first length is substantially equal to a distance between a plane of the wafer platform and a plane of an ion emitter for the implanter such that when the position of the wafer platform is properly calibrated at a zero-angle position, the first and second linear rod fit snugly on the implanter; and at least one cross-bracing rod connected in-between and juxtaposed to the two backends of the first and second linear rod for providing rigidity to the apparatus.

In the apparatus for calibrating the position of a wafer platform in an ion implanter, the first and second rigid materials are selected from a group consisting of aluminum, stainless steel and fiber reinforced plastic. The inside diameter of the curvilinear piece is equal to the outside diameter of the wafer platform. The at least one cross-bracing rod may be two cross-bracing rods with one connecting the two backends of the first and second linear rods. The apparatus may further include means for adjusting the first length of the first and second linear rods, or means for increasing the first length of the first and second linear rods.

The present invention further discloses a method for calibrating the position of a wafer platform in an ion implanter which can be carried out by the operating steps of first providing an apparatus the includes a curvilinear piece formed of a first rigid material, the curvilinear piece has a half-circular shape, a predetermined thickness, a predetermined depth, an inside diameter, an inside peripheral surface, a first open end and a second open end; a first and a second linear rod formed of a second rigid material and has equally a first length, a rectangular cross-section, two front ends and two backends, the two front ends have a thickness substantially equal to the predetermined thickness of the curvilinear piece for mounting the curvilinear piece thereon by engaging the first and second open ends of the curvilinear piece, the curvilinear piece has a plane along radial direction that is perpendicular to a plane of the first and second linear rod along a longitudinal direction when the curvilinear piece is mounted to the first and second linear rod, and at least one cross-bracing rod connected in-between and adjacent to the two backends of the first and second linear rods for providing rigidity of the apparatus; and mounting the curvilinear piece on top of the wafer platform such that the inside peripheral surface intimately engages an outside peripheral surface of the wafer platform and verifying the wafer platform is properly calibrated at a zero-angle position.

The method for calibrating the position of a wafer platform in an ion implanter may further include the step of forming the curvilinear piece and the first and second linear rods in a material selected from the group consisting of aluminum, stainless steel and fiber enforced nylon. The method may further include the step of providing two cross-bracing rods connecting in-between the first and second linear rods with one of the two cross-bracing rods positioned juxtaposed to the two backends of the first and second linear rods, or the step of mounting a length-adjusting means onto the first and second linear rods, or the step of increasing the first length of the first and second linear rods.

The present invention is further directed to a method for calibrating the position of a wafer platform in an ion implanter which can be carried out by the operating steps of first providing an apparatus that includes a curvilinear piece formed of a first rigid material, the curvilinear piece has a half-circular shape, a predetermined thickness, a predetermined depth, an inside diameter, an inside peripheral surface, a first open end and a second open end, a first and a second linear rod formed of a second rigid material and has equally a first length, a rectangular cross-section, two front ends and two backends, the two front ends have a thickness substantially equal to the predetermined thickness of the curvilinear piece for mounting the curvilinear piece thereon by engaging the first and second open end of the curvilinear piece, the curvilinear piece has a plane along radial direction that is perpendicular to a plane of the first and second linear rod along a longitudinal direction when the curvilinear piece is mounted to the first and second linear rod, and at least one cross-bracing rod connected in-between and juxtaposed to the two backends of the first and second linear rod for providing rigidity of the apparatus; and mounting the curvilinear piece on top of the wafer platform such that the first and second linear rod fit snugly with a spacing of less than 0.5 mm on the implanter indicative of a proper calibration at a zero-angle position for the wafer platform.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for calibrating the position of a wafer platform in an ion implanter, and are particularly suited for calibrating the position of a wafer platform in a medium current ion implanter.

The apparatus may be constructed of a rigid material, such as aluminum or stainless steel, or a fiber reinforced plastic. The apparatus may be constructed of three major components of a curvilinear piece, a pair of linear rods and at least one cross-bracing rod.

Figure 1:
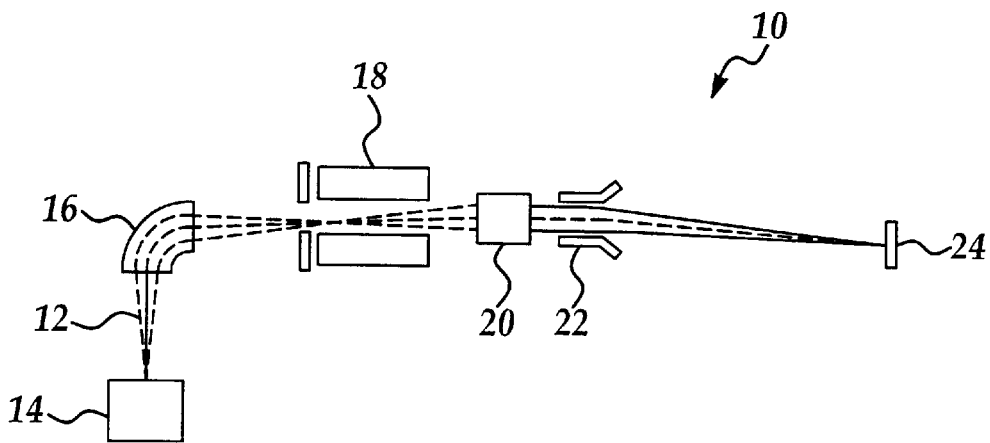
FIG. 1 is a schematic illustrating the setup of a conventional medium current ion implanter.
Figure 2:
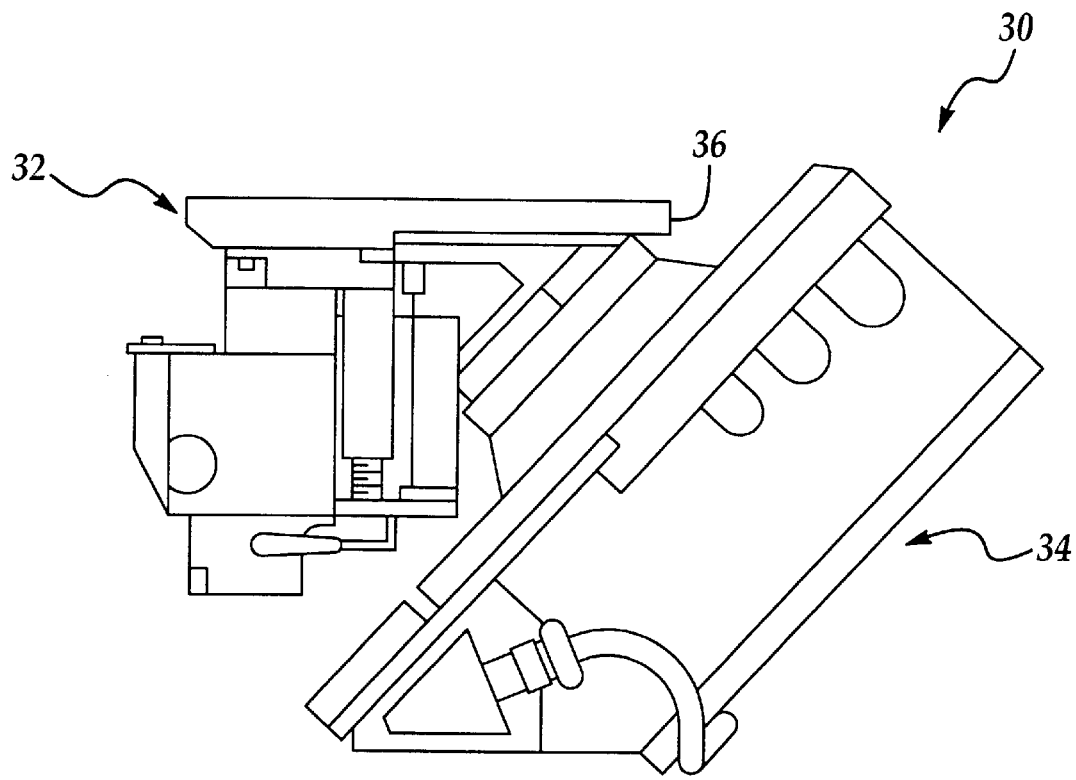
FIG. 2 is a side view of a sample mounting stage including a rotating head and a wafer platform for the conventional medium current ion implanter.
Figure 3:
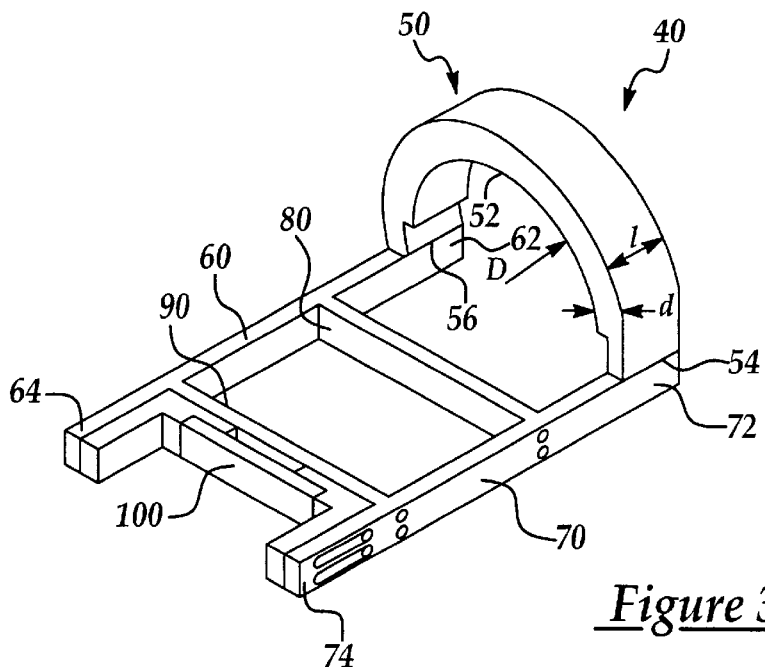
FIG. 3 is a perspective view of the present invention apparatus for calibrating the position of a wafer platform in a medium current ion implanter.

The curvilinear piece 50, as shown in FIG. 3 in the present invention apparatus 40, has a half-circular shape, a predetermined thickness d, a predetermined depth 1, an inside diameter D, an inside peripheral surface 52, a first open end 54 and a second open end 56. The inside diameter D of the curvilinear piece 50 should be substantially the same as the outside diameter of the wafer platform 32. The word "substantially" used in this writing indicates the two values are within ±0.5 mm. This allows the curvilinear piece 50 to be mounted, or straddled on top of the wafer platform 32 intimately during the calibration process.

The apparatus 40 is further constructed by a first linear rod 60, a second linear rod 70 which have equal length, a rectangular cross-section, two front ends 62,72, respectively, and two backends 64,74, respectively. The two front ends 62,72 each has a thickness that is substantially equal to the predetermined thickness d of the curvilinear piece for mounting the curvilinear piece thereon by engaging the first and second open end 56,54 of the curvilinear piece. The curvilinear piece 50 further has a plane along a radial direction that is perpendicular to a plane of the first and second linear rods 60,70 along a longitudinal direction when the curvilinear piece is mounted to the first and second linear rods 60,70. The first length of the first and second linear rods is substantially equal to a distance between a plane of the wafer platform 32 (when tilted in a vertical direction) and a plane of an ion emitter (not shown) for the implanter such that when the position of the wafer platform 32 is properly calibrated at a zero-angle position, the first and second linear rods fit snugly (with less than 0.5 mm spacing) on the implanter.

The apparatus 40 is further constructed by at least one cross-bracing, i.e., two cross-bracing rods 80,90 are shown in FIG. 3 for connecting in-between the first and second linear rods 60,70 for providing rigidity to the apparatus 40. At least one of the cross-bracing rods of 80,90 should be connected at near the backends 64,74 of the two linear rods 60,70. This is shown as cross-bracing rod 90 in FIG. 3.

The apparatus 40 may further include adjusting means 100 for adjusting the first length of the first and second linear rods 60,70. A purpose for the adjusting means 100 is to increase the first length of the first and second linear rods 60,70. As shown in FIG. 3, the adjusting means 100 can be slid out of and away from the cross-bracing rod 90 to extend the length of the two linear rods 60,70.

Figure 4:
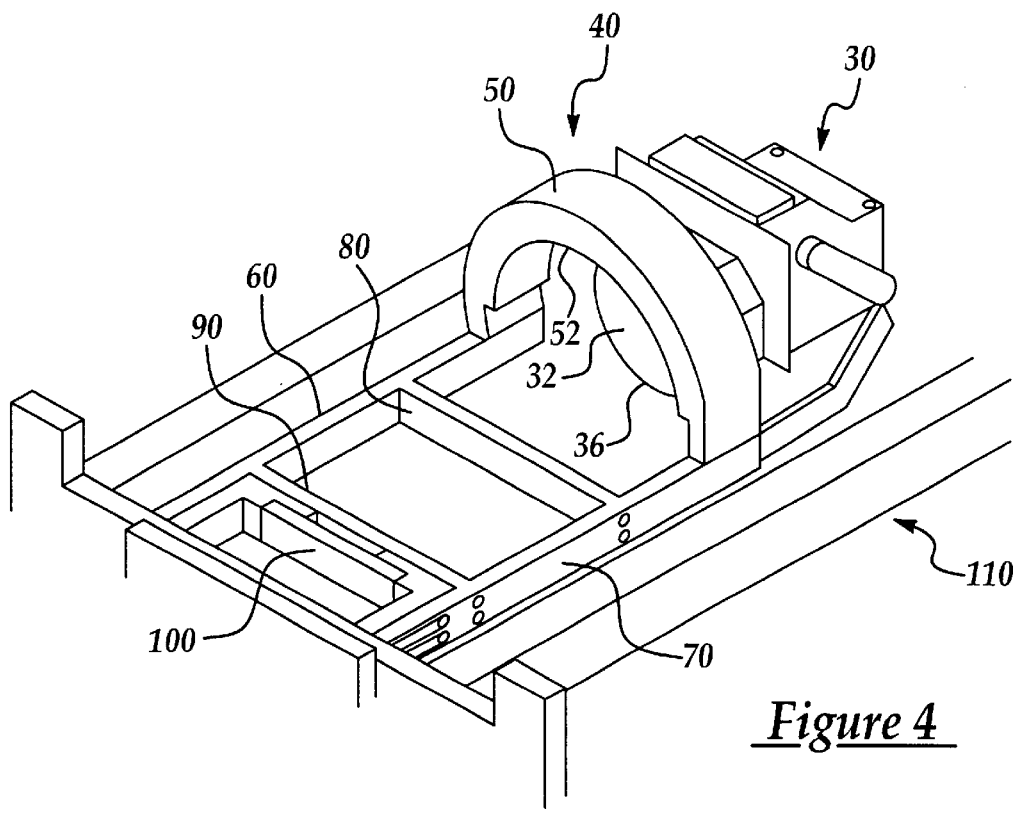
FIG. 4 is a perspective view of the present invention apparatus for calibrating the position of a wafer platform mounted in a medium current ion implanter.

The operation of the present invention novel apparatus for calibrating the position of a wafer platform in a medium current ion implanter is shown in FIG. 4. The apparatus 40 is positioned on top of an ion implanter 110 which is equipped with the sample mounting stage 30 and the wafer platform 32. When the curvilinear piece 50 of the apparatus 40 is mounted, or straddled on top of the wafer platform 32 such that the inside peripheral surface 52 intimately engages an outside peripheral surface 36 of the wafer platform 32 indicative that the wafer platform 32 is properly calibrated at a zero-angle position. The calibration may further be confirmed by the fact that the first and second linear rods 60,70 fit snugly with a spacing of less than 0.5 mm on the implanter 110 indicative of a proper calibration of the zero-angle position for the wafer platform 32.

The present invention novel apparatus and method for calibrating the position of a wafer platform in a medium current ion implanter have therefore been amply described in the above description and in the appended drawings of FIGS. 3 and 4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An apparatus for calibrating a position of a wafer platform in an ion implanter comprising:

a curvilinear piece formed of a first rigid material, said curvilinear piece having a half-circular shape, a predetermined thickness, a predetermined depth, an inside diameter, an inside peripheral surface, a first open end and a second open end, said inside diameter being substantially equal to an outside diameter of said wafer platform such that said inside peripheral surface intimately engages an outside peripheral surface of said wafer platform when said wafer platform is properly calibrated at a zero-angle position;

a first and a second linear rod formed of a second rigid material and having equally a first length, a rectangular cross-section, two front ends and two backends, said two front ends having a thickness substantially equal to said predetermined thickness of said curvilinear piece for mounting said curvilinear piece thereon by engaging said first and second open end of said curvilinear piece, said curvilinear piece having a plane along radial direction that is perpendicular to a plane of said first and second linear rod along a longitudinal direction when said curvilinear piece is mounted to said first and second linear rod, said first length being substantially equal to a distance between a plane of said wafer platform and a plane of an ion emitter for said implanter such that when the position of said wafer platform is properly calibrated at a zero-angle position, said first and second linear rod fit snugly on said implanter; and at least one cross-bracing rod connected in-between and juxtaposed to the two backends of said first and second linear rod for providing rigidity of said apparatus.

2. The apparatus for calibrating the position of the wafer platform in an ion implanter according to claim 1, wherein said first and second rigid material are selected from the group consisting of aluminum, stainless steel and fiber reinforced plastic.

3. The apparatus for calibrating the position of the wafer platform in an ion implanter according to claim 1, wherein said inside diameter of said curvilinear piece being equal to said outside diameter of said wafer platform.

4. The apparatus for calibrating the position of the wafer platform in an ion implanter according to claim 1, wherein said at least one cross-bracing rod being two cross-bracing rods with one connecting said two backends of said first and second linear rods.

5. The apparatus for calibrating the position of the wafer platform in an ion implanter according to claim 1 further comprising means for adjusting the first length of said first and second linear rod.

6. The apparatus for calibrating the position of the wafer platform in an ion implanter according to claim 1 further comprising means for increasing the first length of said first and second linear rod.

* * * * *